(12) United States Patent
Nakashima et al.

(10) Patent No.: US 8,196,278 B2
(45) Date of Patent: Jun. 12, 2012

(54) METHOD FOR TAKING AN ELECTRONIC COMPONENT OUT OF A CARRIER TAPE

(75) Inventors: Tomokazu Nakashima, Kawasaki (JP); Masako Okazaki, Ota (JP); Masayuki Itoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 27 days.

(21) Appl. No.: 12/654,116

(22) Filed: Dec. 10, 2009

(65) Prior Publication Data
US 2010/0132189 A1 Jun. 3, 2010

Related U.S. Application Data

(63) Continuation of application No. PCT/JP2007/061876, filed on Jun. 13, 2007.

(51) Int. Cl.
*H05K 13/04* (2006.01)
(52) U.S. Cl. .......... 29/426.6; 29/426.1; 29/739; 29/743; 29/832
(58) Field of Classification Search ...... 29/426.1–426.6, 29/429; 414/787, 225; 209/576; 198/774
See application file for complete search history.

(56) References Cited

U.S. PATENT DOCUMENTS

| | | | |
|---|---|---|---|
| 3,668,769 A * | 6/1972 | Conn et al. ................. | 29/419.2 |
| 4,494,902 A * | 1/1985 | Kuppens et al. ............. | 221/74 |
| 4,740,136 A * | 4/1988 | Asai et al. .................. | 414/787 |
| 4,923,089 A * | 5/1990 | Hineno et al. .............. | 221/1 |
| 5,098,501 A * | 3/1992 | Nishiguchi ................. | 156/275.5 |
| 5,177,855 A * | 1/1993 | Shimai ...................... | 29/408 |
| 5,452,506 A * | 9/1995 | Biedermann et al. ....... | 29/426.4 |
| 5,810,962 A * | 9/1998 | Annenkov et al. .......... | 156/706 |
| 5,827,394 A * | 10/1998 | Lu .............................. | 156/701 |
| 5,908,114 A * | 6/1999 | Althouse et al. ............ | 206/714 |
| 6,039,833 A * | 3/2000 | Freund et al. ............... | 156/765 |
| 6,076,681 A * | 6/2000 | Chenoweth .................. | 206/714 |
| 6,156,150 A * | 12/2000 | Nishida ....................... | 156/701 |
| 6,173,750 B1 * | 1/2001 | Davis et al. ................. | 156/765 |
| 6,176,966 B1 * | 1/2001 | Tsujimoto et al. ........... | 156/701 |
| 6,451,628 B1 * | 9/2002 | Tani et al. ................... | 438/112 |
| 6,536,593 B2 * | 3/2003 | Hatakeyama ................ | 206/714 |
| 7,930,819 B2 * | 4/2011 | Yonemitsu et al. .......... | 29/739 |
| 2002/0005370 A1 * | 1/2002 | Hatakeyama ................ | 206/714 |
| 2002/0100162 A1 * | 8/2002 | Kawada ....................... | 29/739 |

(Continued)

FOREIGN PATENT DOCUMENTS

JP 6-211389 8/1994

(Continued)

OTHER PUBLICATIONS

International Search Report for PCT/JP2007/061876, mailed Sep. 18, 2007.

(Continued)

*Primary Examiner* — Derris Banks
*Assistant Examiner* — Kaying Kue
(74) *Attorney, Agent, or Firm* — Staas & Halsey LLP

(57) ABSTRACT

A method for taking an electronic component out of a carrier tape configured to house the electronic component in a concave that is defined by a sidewall and a bottom surface reduces a binding force applied by the concave to the electronic component by stretching the sidewall to outside near a perforation hole that is formed at least one of the sidewall and a portion of the bottom surface adjacent to the sidewall.

19 Claims, 7 Drawing Sheets

U.S. PATENT DOCUMENTS

2002/0178567 A1* 12/2002 Farnworth et al. ........... 29/426.5
2006/0248714 A1* 11/2006 Kawada .......................... 29/832

FOREIGN PATENT DOCUMENTS

| JP | 9-169386 | 6/1997 |
|---|---|---|
| JP | 09-202388 | 8/1997 |
| JP | 11-59725 | 3/1999 |
| JP | 11-59776 | 3/1999 |
| JP | 2000-296876 | 10/2000 |
| JP | 2006-120890 | 5/2006 |

OTHER PUBLICATIONS

Japanese Office Action issued Mar. 13, 2012 is corresponding Japanese Patent Application 2009-519093.

* cited by examiner

METHOD FOR TAKING AN ELECTRONIC COMPONENT OUT OF A CARRIER TAPE

This application is a continuation that claims the benefit of International Application No. PCT/JP2007/061876, filed Jun. 13, 2007, which is hereby incorporated by reference herein in its entirety.

BACKGROUND OF THE INVENTION

1. Field of the Invention

The present invention relates generally to a carrier tape that has a concave (also referred to as an "emboss," "pocket," or "cavity") configured to accommodate an electronic component, and more particularly to a method for taking an electronic component out of a carrier tape.

2. Description of the Related Art

It is conventionally known that an electronic component that has been housed in a resin carrier tape and carried to a mount position is taken out by an absorption nozzle of a mount unit and mounted onto a printed (circuit) board. It is necessary for an electronic component that is a chip component to align electrodes of the chip component with footprints on the printed board and thus to maintain a high positioning precision of the electronic component to the printed board. In order to prevent easy movements of the electronic component in the concave of the carrier tape, it is necessary to maintain an interval of about 0.2 mm between the side surface of the concave and the electronic component. When the electronic component rotates in the concave under this fine interval, the lower side surfaces of the electronic component are held and positioned in the concave. The resin carrier tape provides a binding force as an elastic force to the electronic component.

As the binding force to the electronic component in the cavity is increased, the binding force may exceed the absorption force by the absorption nozzle and the electronic component cannot become regularly taken out of the carrier tape. As a result, a yield of the mount may lower due to the absorption error. An increase of the absorption force by the absorption nozzle is undesirable, because the electronic component receives an excessive load and may get damaged.

Japanese Patent Laid-Open No. ("JP") 11-59725 proposes a method for reducing a binding force by providing a cross slit to the center of the bottom surface of the carrier tape. JPs 11-59776 and 09-169386 propose a carrier tape in which each side of its bottom surface has a slit.

However, simply providing the slit does not significantly reduce the binding force by the carrier tape to the electronic component. Thus, it is conventionally difficult to mitigate the binding force in taking the electronic component out of the carrier tape.

SUMMARY OF THE INVENTION

The present invention provides a method for stably taking an electronic component out of a carrier tape.

A method according to one aspect of the present invention for taking an electronic component out of a carrier tape configured to house the electronic component in a concave that is defined by a sidewall and a bottom surface includes the step of reducing a binding force applied by the concave to the electronic component by stretching the sidewall to outside near a perforation hole that is formed at least one of the sidewall and a portion of the bottom surface adjacent to the sidewall. This method maintains the positioning precision of the electronic component by maintaining the binding force applied by the concave to the electronic component until the electronic component is taken out, and facilitate the takeout by reducing the binding force just before the electronic component is taken out. Thereby, both maintaining of the positioning precision of the electronic component in the carrier tape and mitigating of the binding force at the time of takeout can be reconciled.

The perforation hole may be formed in the portion of the bottom surface adjacent to the sidewall in the concave. In that case, the step may engage a hook tool with the perforation hole and move the hook tool so as to stretch the sidewall to the outside. The hook tool stretches the portion of the concave which applies the binding force, and can facilitate the takeout. The step may insert a tool having a tapered surface into the perforation hole and stretch the sidewall to the outside via the tapered surface. In addition, the step may bring the tool into contact with a bottom surface of the electronic component opposite to the bottom surface of the concave and move the tool in a direction in which the electronic component can be separated from the bottom surface of the concave. The tapered surface stretches the concave and moves the electronic component, facilitating the takeout. The step may supply wind, heat or light to part around the perforation hole to stretch the sidewall to the outside. The wind, heat, and light stretch the portion of the concave which applies the binding force, and can facilitate the takeout.

A manufacturing method of an electronic unit according to another aspect of the present invention includes the steps of moving a printed board to a mount position, reducing a binding force applied by a concave of a carrier tape configured to house an electronic component in the concave that is defined by a sidewall and a bottom surface, by stretching the sidewall to outside near a perforation hole that is formed at least one of the sidewall and a portion adjacent to the sidewall, and taking the electronic component out of the carrier tape and soldering the electronic component onto the printed board. The manufacturing method of the electronic unit facilitates the takeout of the electronic component through the binding-force reducing step.

A mount unit according to still another aspect of the present invention is configured to take an electronic component out of a carrier tape that houses the electronic component in a concave defined by a sidewall and a bottom surface, and to mount the electronic component onto a printed board. The mount unit includes a binding-force reducer configured to reduce a binding force applied by the concave to the electronic component by stretching the sidewall to outside near a perforation hole that is formed at least one of the sidewall and a portion of the bottom surface adjacent to the sidewall, and an absorption nozzle configured to absorb a top surface of the electronic component opposite to a bottom surface of the electronic component which is opposite to the bottom surface of the concave. According to this mount unit, the binding-force reducer reduces the binding force and facilitates the absorption of the electronic component by the absorption nozzle, preventing a deterioration of a yield, which is caused by the absorption error.

The perforation hole may be formed in the portion of the bottom surface adjacent to the sidewall in the concave. In that case, the binding-force reducer may include a hook tool configured to engage with the perforation hole and to stretch the sidewall to the outside. The hook tool stretches the portion of the concave which applies the binding force, and can facilitate the takeout. The binding-force reducer may include a tool having a tapered surface configured to stretch out the sidewall. The tool may be configured to contact a bottom surface of the electronic component and to move in a direction in which the bottom surface of the electronic component can be separated from the bottom surface of the concave. The tapered surface stretches the concave and moves the electronic component, facilitating the takeout. The binding-force reducer may include a blower configured to supply wind to part around the perforation hole, a heater configured to heat around the perforation hole, or a light irradiator configured to irradiate light onto part around the perforation hole, so as to stretch the sidewall to the outside. The wind, heat, and light stretch the portion of the concave which applies the binding force, and can facilitate the takeout.

A assembly line apparatus according to still another aspect of the present invention includes a supply mechanism configured to supply a carrier tape that is configured to house an electronic component in a concave defined by a sidewall and a bottom surface, and a mount unit configured to take the electronic component out of the carrier tape and to mount the electronic component onto a printed board, said mount unit including a binding-force reducer configured to reduce a binding force applied by the concave to the electronic component by stretching the sidewall to outside near a perforation hole that is formed at least one of the sidewall and a portion of the bottom surface adjacent to the sidewall. This assembly line apparatus exhibits an operation similar to that of the above mount unit.

Further features of the present invention will become apparent from the following description of exemplary embodiments with reference to the attached drawings.

DESCRIPTION OF THE EMBODIMENTS

Figure 1:
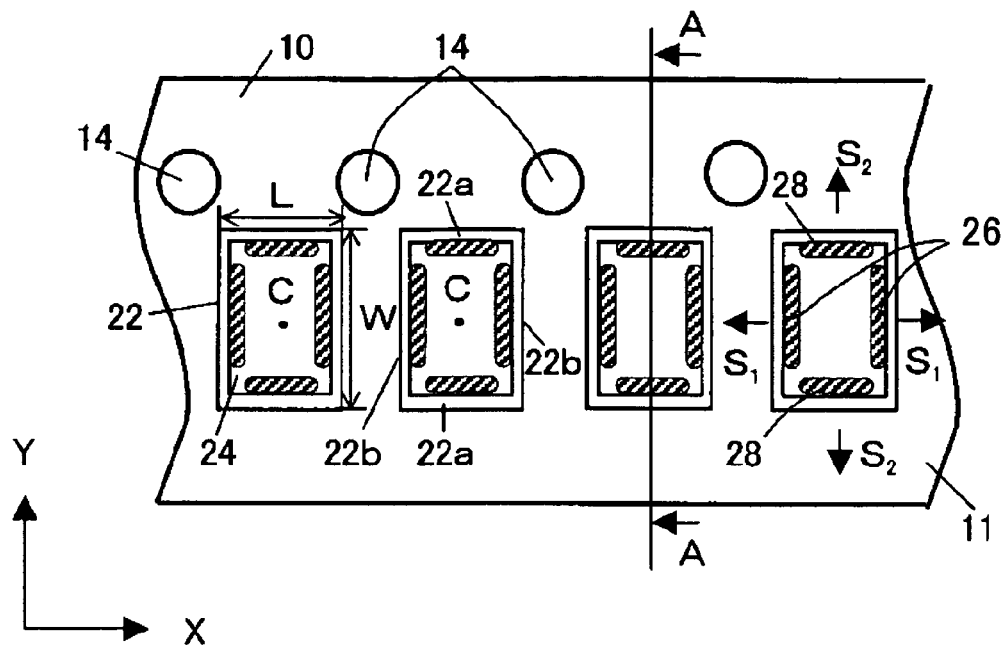
FIG. 1 is a schematic plane view of a carrier tape according to one embodiment of the present invention.
Figure 2:
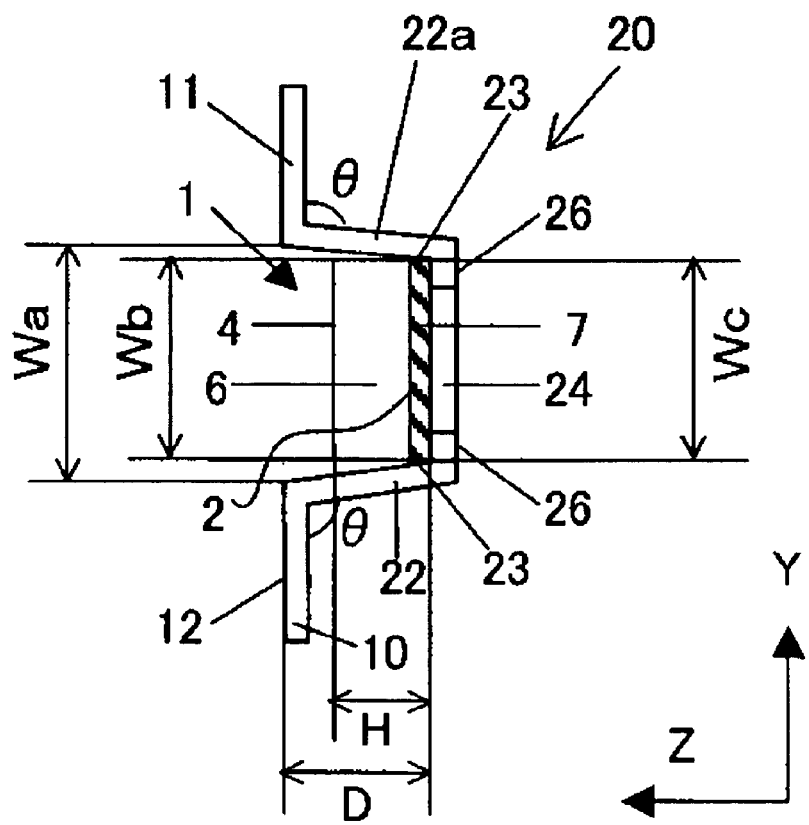
FIG. 2 is a sectional view taken along a line A-A in FIG. 1.

Referring now to FIGS. 1 and 2, a description will be given of a carrier tape 100 according to one aspect of the present invention. Here, FIG. 1 is a schematic plane view of the carrier tape 10, and FIG. 2 is a sectional view taken along a line A-A in FIG. 1. FIG. 1 omits an electronic component 1 shown in FIG. 2 so that perforation holes 26 and 28 can be easily recognized.

The carrier tape 10 is used to house, hold, and carry the electronic component 1. The electronic component 1 of this embodiment is a chip component 5 mm square. However, a type and size of the electronic component 1 are not limited, and the electronic component 1 may include an electronic component such as a semiconductor device, a resistor, and a capacitor. The electronic component 1 has a bottom surface 2 that faces a bottom surface 24 of a concave 20 of the carrier tape 10, a top surface 4 that is a back of the bottom surface 2, and four side surfaces 6 between the bottom surface 2 and the top surface 4. The top surface 4 is closer to a top surface 12 of the carrier tape 10 than the bottom surface 2.

The carrier tape 10 has a base 11 and a concave 20. The carrier tape 10 is made of resin in this embodiment, has an elastic force.

The base 11 is a stripe member that extends in the X direction while the top surface 12 faces the upside of the Z direction, as shown in FIG. 1. The base 11 has a plurality of sprocket holes (perforation holes) 14 which have the same shape and are arranged at regular intervals in the X direction. In this embodiment, the X direction accords with the longitudinal direction of the carrier tape. The centers of the plurality of sprocket holes 14 are aligned with a straight line, which is parallel to the X direction. A pin of a tape feeder (not shown in FIG. 1) is inserted into the sprocket hole 14 and used to carry the carrier tape 10.

The concave 20 serves as the conventional emboss. Each of a plurality of concaves 20 is formed at the center of the base 11 in the Y direction as a width direction. The centers C of the plurality of concaves 20 are arranged on the same straight line, which is parallel to the X direction and accords with the centerline of the base 11 which is also parallel to the X direction. The concave 20 is formed in the base 11 by molding or pressing.

Each concave is used to house and hold one electronic component 1, and sealed by a cover (not shown). The concave 20 is defined by two pairs of sidewalls 22 and one bottom surface 24, as shown in FIG. 2. The two pairs of sidewalls 22 include a pair of sidewalls 22a and a pair of sidewalls 22b. The sidewalls 22a determine a length L of the concave 20 in the X direction, and the sidewalls 22b determine a length W of the concave 20 in the Y direction.

In this embodiment, angles θ formed between the top surface 12 of the base 11 and the pair of sidewalls 22a are equal to each other and set to 90° or larger. Similarly, angles θ formed between the top surface 12 of the base 11 and the pair of sidewalls 22b are equal to each other and set to 90° or larger. However, the present invention allows these angles to be different from each other. This angle θ is an inclination necessary to form the concave 20 through molding. The sidewall 22 may be a tapered surface, as shown in FIG. 2, and an excessively large taper angle is not preferable because the electronic component 1 easily moves. This embodiment sets the taper angle between 90° and 110°.

The concave 20 of this embodiment has a trapezoidal section along the X or Y direction. In other words, the concave 20 has a prismoid shape. However, the present invention does not limit the shape of the concave 20, and the concave 20 may be a truncated cone or a truncated polygon-moid shape.

In order to protect the electronic component 1, a depth D of the concave 20 in the Z direction is larger than a corresponding height H of the electronic component 1 in the Z direction. A length L of the prismoid of the concave 20 on the top surface 12 side in the X direction is larger than a corresponding length of the electronic component 1 in the X direction, and a length on the bottom surface 24 side in the X direction is or slightly longer (by about 0.2 mm) than a corresponding length of the electronic component 1 in the X direction. A length Wa of the prismoid of the concave 20 on the top surface 12 side in the Y direction is larger than a corresponding length Wb of the electronic component 1 in the Y direction, and a length Wc on the bottom surface 24 side in the Y direction is slightly longer (by about 0.2 mm) than a corresponding length Wb of the electronic component 1 in the Y direction. When the electronic component 1 slightly rotates in the concave 20, a hatched lower portion 7 of the side surface 6 of the electronic component 1 near the bottom surface 2 receives an elastic force or a binding force from a lower portion 23 of the sidewall 22 near the bottom surface 24. In this embodiment, the lower portion 7 on one of side surfaces 6 receives the binding force from one of the sidewalls 22a and 22b among the four sidewalls 22, which has a smaller difference between the length of the electronic component 1 and the length of the concave 20 on the bottom surface 24 side.

This binding force fixes the electronic component 1 in the concave 20 and hinders the absorption by the absorption nozzle configured to pick up the electronic component 1 at the absorption position after the carrier tape 10 moves to the absorption position of the electronic component 1. Therefore, this binding force provides originally unnecessary binding. When the electronic component 1 is a chip component, its both ends are provided with electrodes and the printed board is provided with corresponding footprints. In order to prevent positional shifts between them, the electronic component 1 needs a high positioning precision.

The bottom surface 24 opposes to and supports the bottom surface 2 of the electronic component 1. The bottom surface 24 has a similar rectangular shape to that of the bottom surface 2 of the electronic component 1. The bottom surface 24 has two pairs of perforation holes (or slits) 26 and 28. As shown in FIG. 1, the perforation hole 26 extends in the Y direction, and the perforation hole 28 extends in the X direction. The perforation holes 26 and 28 are formed along the sides of the bottom surface 24 except for four corners of the bottom surface 24. The width of each perforation hole 26 in the X direction and the width of each perforation hole 28 in the Y direction are not particularly limited, and they are set equal to each other in this embodiment.

As described later, a pair of perforation holes 26 are forced so that they can be separated from each other in an $S_1$ direction shown in FIG. 1. A pair of perforation holes 28 are forced so that they can be separated from each other in an $S_2$ direction shown in FIG. 1. If the perforation hole 26 is excessively long in the Y direction and the perforation hole 28 is excessively long in the X direction, the bottom surface 24 may tear, the perforation holes 26 and 28 may be connected to each other, and thereby the electronic component 1 may drop when the force is applied. Therefore, this embodiment maintains rigid areas at four corners of the bottom surface 24 to some extent. In addition, this embodiment maintains an interval (closest distance) between the perforation holes 26 and 28 to some extent. This embodiment sets the width of the perforation hole 26 in the X direction and the width of the perforation hole 28 in the Y direction to 2 mm or smaller.

The perforation holes 26 and 28 are provided so as to release the application of the binding force by the lower portion 23 of the sidewall 22. Therefore, it is provided adjacent to each sidewall 22. If the perforation holes 26 and 28 are provided near the center C of the bottom surface 24, the transmission efficiencies in the $S_1$ and $S_2$ directions lower. Thus, this embodiment sets a distance between the sidewall 22b and a part of the perforation hole 26 closest to the sidewall 22b to almost 0, and a distance between the sidewall 22a and a part of the perforation hole 28 closest to the sidewall 22a to almost 0.

While this embodiment provides the perforation holes 26 and 28 to the bottom surface 24, the perforation holes 26 and 28 may be provided to at least one of the sidewall 22 and the bottom surface 24.

Figure 3:
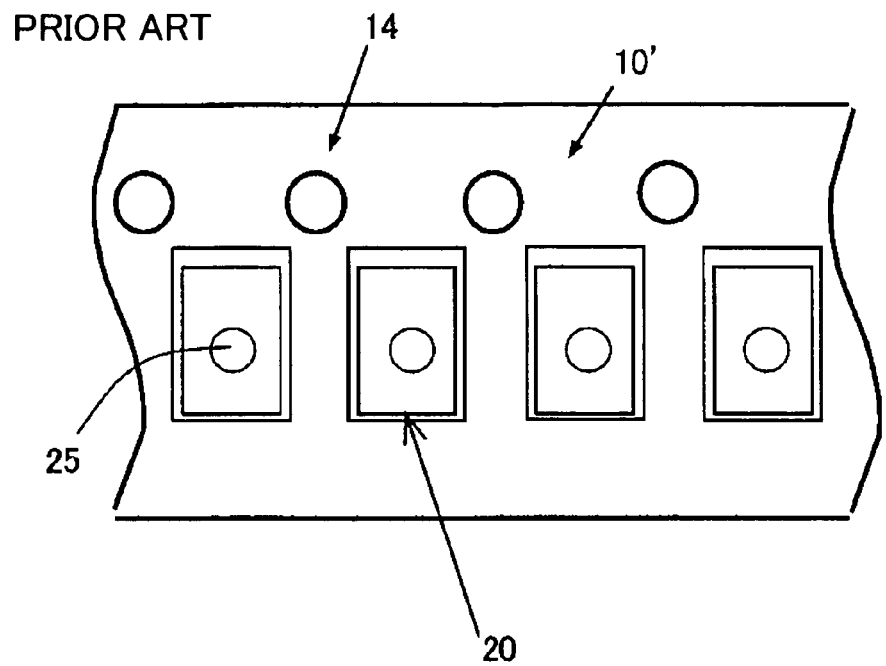
FIG. 3 is a schematic plane view of a conventional carrier tape.

FIG. 3 is a plane view of a conventional carrier tape 10' having a perforation hole 25 near the center C of the bottom surface 24. This carrier tape 10' cannot provide an effect of the present invention because of a low transmission efficiency of a force to the lower portion 23 of the sidewall 22, as described above.

Referring now to FIGS. 4-7, a description will be given of a method of applying a force to the perforation holes 26 and 28. Here, FIGS. 4-7 are schematic sectional views of the first to fourth binding-force reducers 40A-40D along the Y direction.

Figure 4:
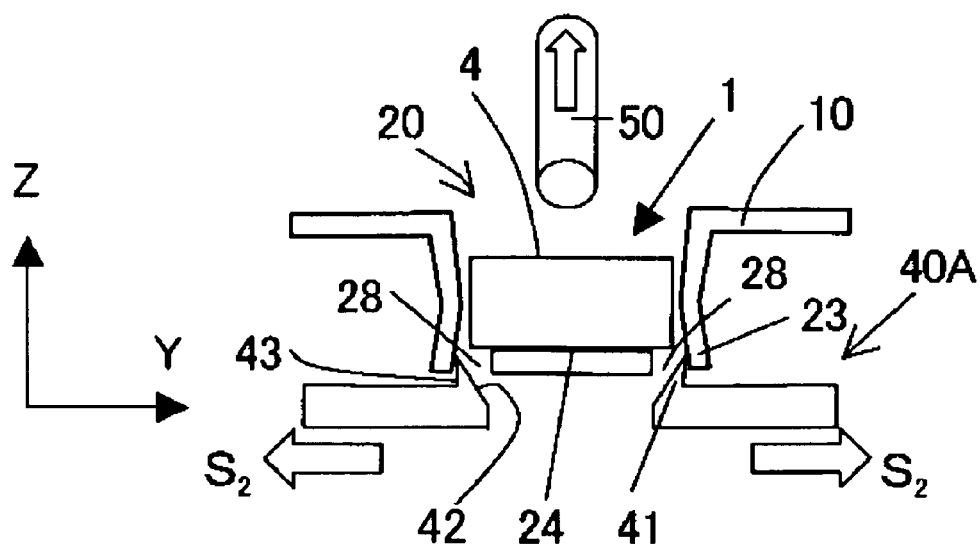
FIG. 4 is a schematic sectional view of a first binding-force reducer.

Referring to FIG. 4, a first binding-force reducer 40A includes a pair of hook tools, and each hook tool has a hook 41. The hook 41 has a triangle pole shape that possesses a tapered surface 42 and an outer vertical surface 43. As a result of that the hooks 41 are inserted into the perforation holes 28, the vertical surfaces 43 contact the lower portions 23 and stretch out the lower portions 23 in the $S_2$ direction, the binding force by the lower portion 23 to the electronic component 1 is reduced or released. The hook 41 is inserted simultaneously with or just before the absorption by the absorption nozzle 50. Although a pair of hook tools (not shown) are inserted into the perforation holes 26 in the X direction and moved in the $S_1$ direction, the operation is similar to that shown in FIG. 4 and a description thereof will be omitted.

Figure 5:
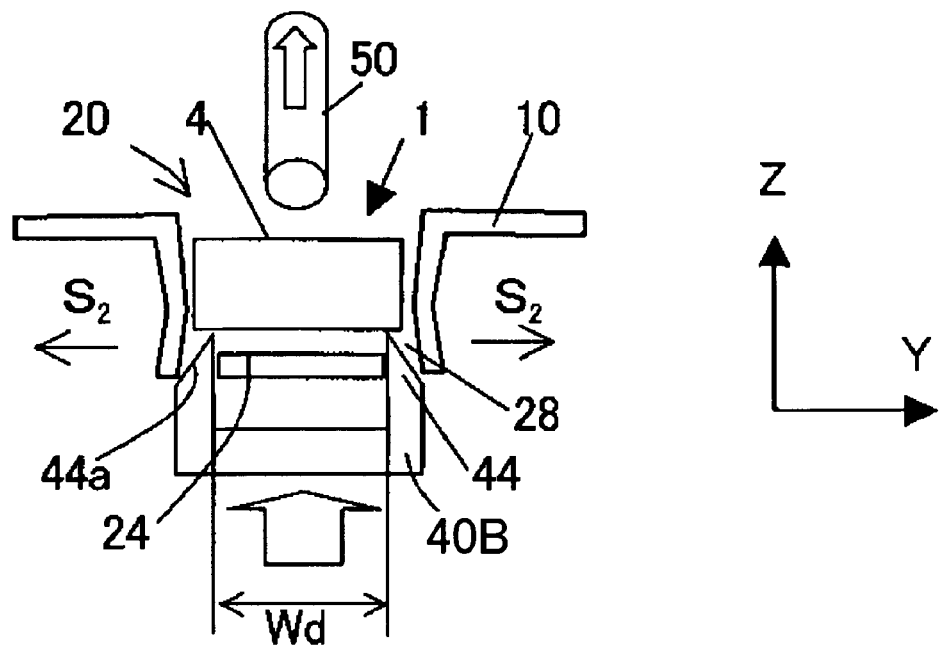
FIG. 5 is a schematic sectional view of a second binding-force reducer.

Referring to FIG. 5, a second binding-force reducer 40B includes a tapered tool having a U-shaped section, and the tapered tool has a pair of triangle pole tips 44 each having a tapered surface 44a. The tapered surfaces 44a are arranged so that each tapered surface 44a faces to the outside. An interval Wd between the pair of tips 44 is equal to or slightly larger than a distance between inner sides of the pair or perforation holes 28. When the tips 44 are inserted into the perforation holes 28 and moved in the Z direction, the tapered surfaces 44a contact the lower portions 23 and stretches out the lower portions 23 in the $S_2$ direction. As a result, the second binding-force reducer 40B reduces or releases the application of the binding force to the electronic component 1 by the lower portions 23. In addition, the heads of the tips 44 contact the edges of the bottom surface 2 of the electronic component 1 and move the electronic component 1 upwardly in the Z direction. The movement in the Z direction can help the absorption action of the electronic component 1 by the absorption nozzle 50, and increases the absorption force by approaching the electronic component 1 to the absorption nozzle 50. In order to prevent damages of the electronic component 1 due to the collision between the electronic component 1 and the absorption nozzle 50, a moving amount in the Z direction needs to be set smaller than an interval between the electronic component 1 and the absorption nozzle 50. This embodiment sets the moving amount in the Z direction to 0.1 mm while the interval between the electronic component 1 and the absorption nozzle 50 is 0.2 mm. The tip 44 is inserted simultaneous with, just before or just after the absorption of the absorption nozzle 50. While tips of a tapered tool (not shown) are inserted into the perforation holes 26 in the X direction and moved in the Z direction, the operation is similar to that shown in FIG. 5 and a description thereof will be omitted.

Figure 6:
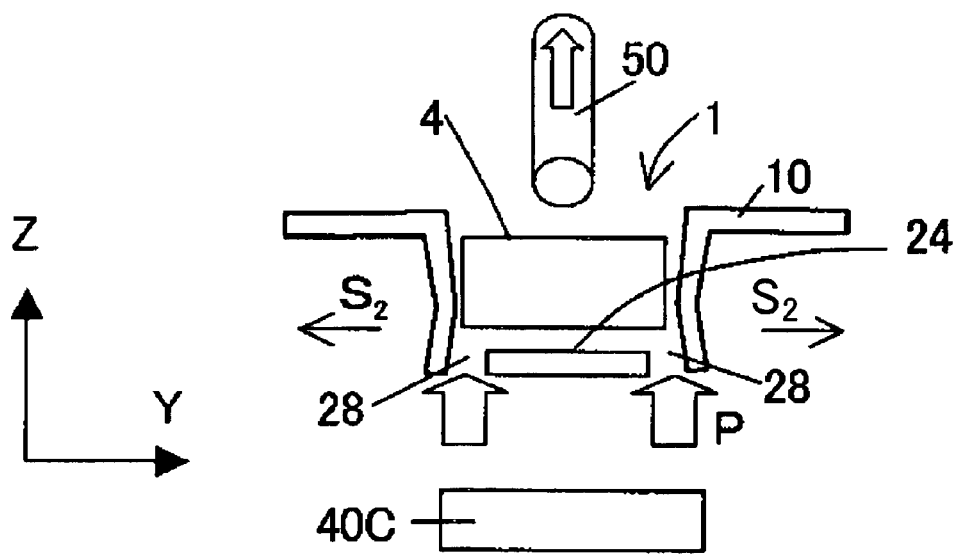
FIG. 6 is a schematic sectional view of a third binding-force reducer.

Referring to FIG. 6, a third binding-force reducer 40C includes a blower, and the blower supplies wind P to the perforation holes 28 in the Z direction. As a result of that the wind P stretches out the lower portions 23 in the $S_2$ direction, the third binding-force reducer 40C releases the application of the binding force to the electronic component 1 by the lower portions 23. The wind P is also blown onto the edges of the bottom surface 2 of the electronic component, and applies forces to the electronic component 1 upwardly in the Z direction. The air is sent simultaneous with, just before, or just after the absorption by the absorption nozzle 50. While the wind P reaches the perforation holes 26 and stretches them in the $S_1$ direction, the operation is similar to that shown in FIG. 6 and a description thereof will be omitted.

Figure 7:
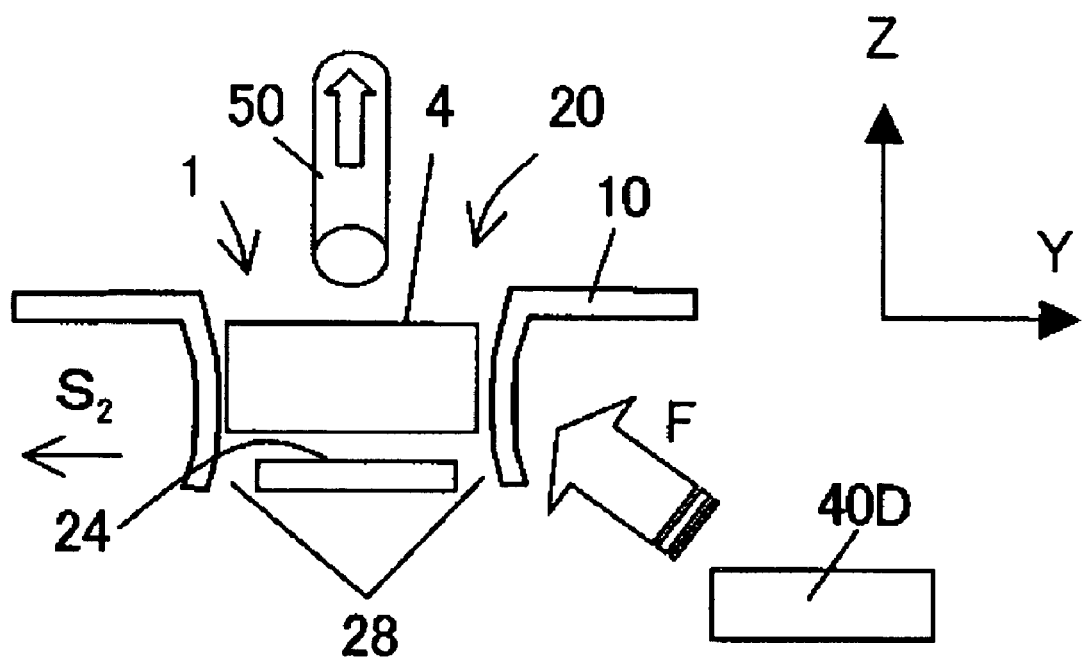
FIG. 7 is a schematic sectional view of a fourth binding-force reducer.

Referring to FIG. 7, a fourth binding-force reducer 40D includes a heater or light irradiator, and supplies heat or light F to the perforation holes 28. As a result of that the heat or light F stretches out the lower portions 23 in the $S_2$ direction, the fourth binding-force reducer 40D reduces or releases the application of the binding force to the electronic component 1 by the lower portions 23. The heating or light irradiation is performed simultaneous with, just before, or just after the absorption by the absorption nozzle 50. While the heat or light F reaches the perforation holes 26 and stretches them in the $S_1$ direction, the operation is similar to that shown in FIG. 7 and a description thereof will be omitted. In heating, the lower portions 23 are configured to deform to the outside or in the $S_1$ or $S_2$ direction. Alternatively, the entire carrier tape 10, the sidewall 22 or the lower portion 23 of the sidewall 22 may be made, for example, of a bimetallic material in order to release the application of the binding force by the lower portion 23. In case of light irradiation, the lower portion 23 is configured to deform to the outside or in the $S_1$ or $S_2$ direction. Alternatively, the entire carrier tape 10, the sidewall 22 or the lower portion 23 of the sidewall 22 may be made, for example, of an organic photochromic material in order to release the application of the binding force by the lower portion 23.

Figure 8A:
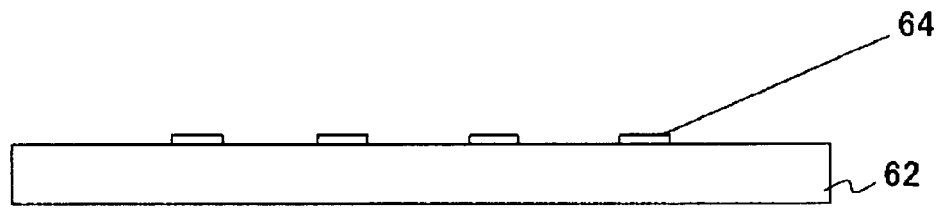
FIGS. 8A-8D are schematic sectional views for explaining illustrative printed board (electronic unit) mounted with the electronic component.
Figure 8B:
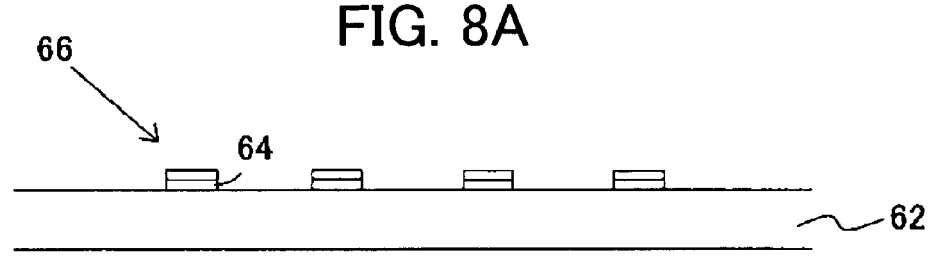
Figure 8C:
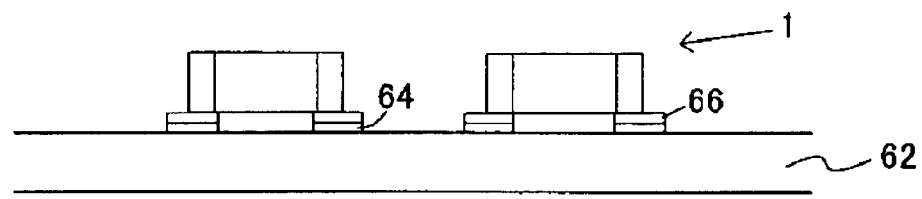
Figure 8D:
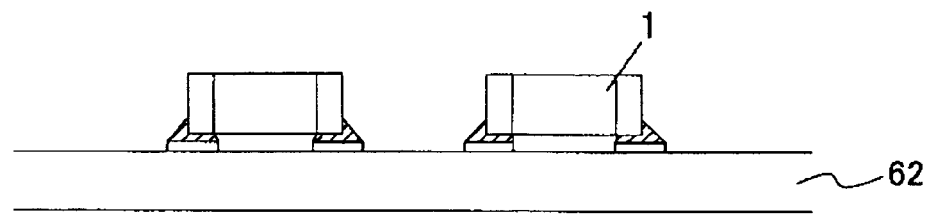
Figure 9:
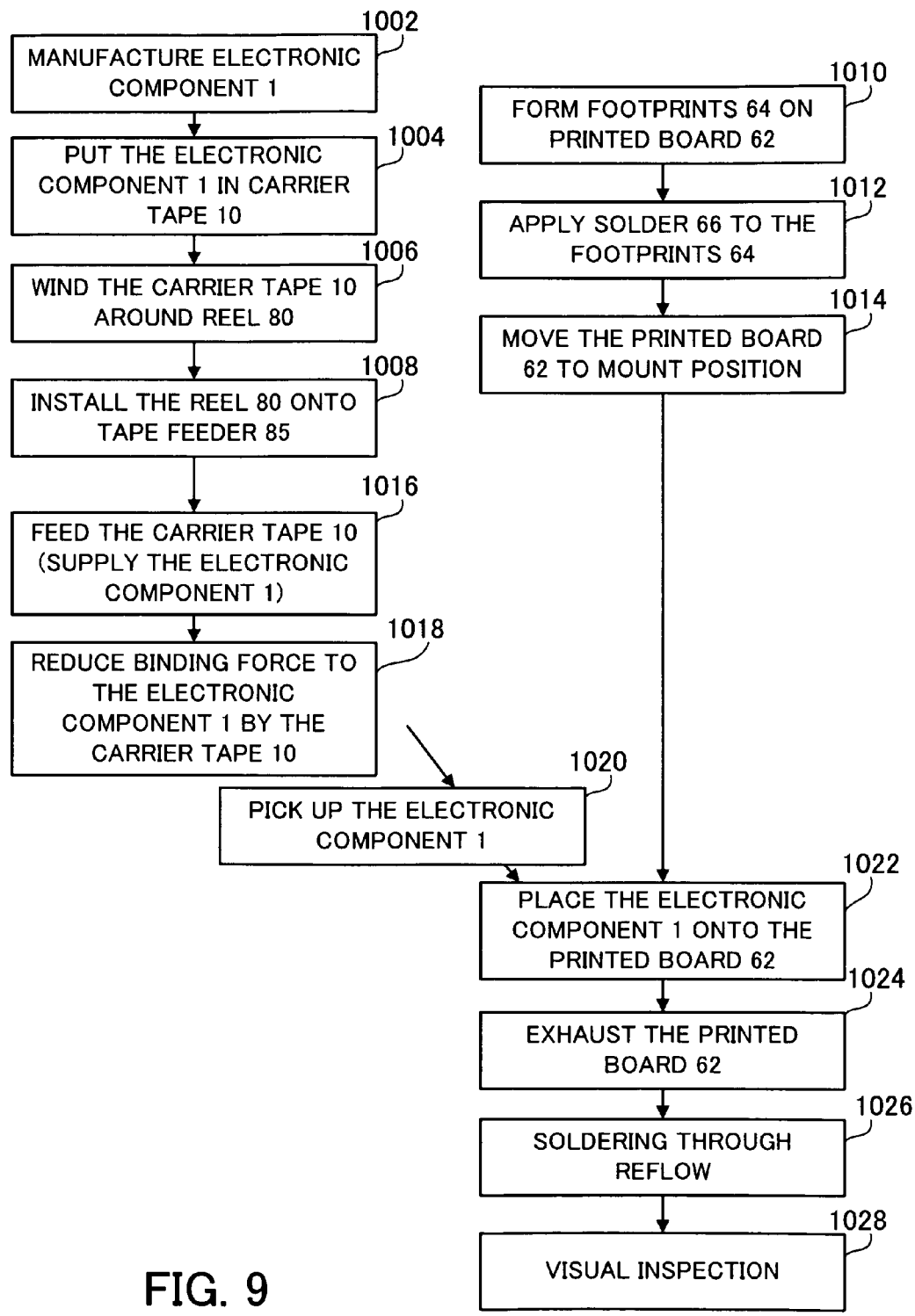
FIG. 9 is a flowchart for explaining a manufacturing method of the electronic unit.
Figure 10:
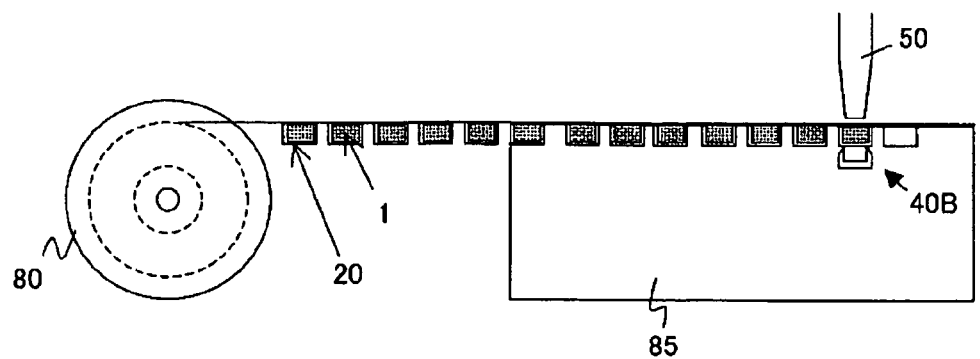
FIG. 10 is a schematic sectional view of a reel and a tape feeder mounted with a carrier tape shown in FIG. 1.
Figure 11:
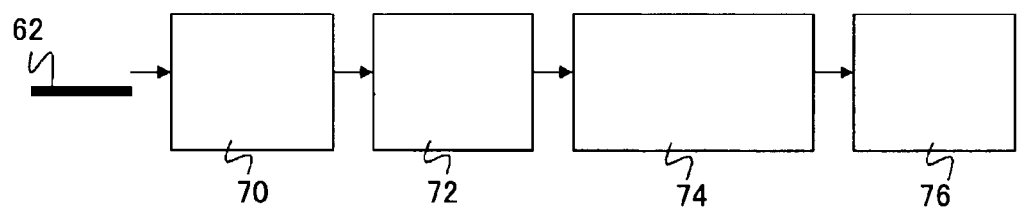
FIG. 11 is a schematic block of a system for implementing the manufacturing method of the electronic unit shown in FIG. 9.
Figure 12:
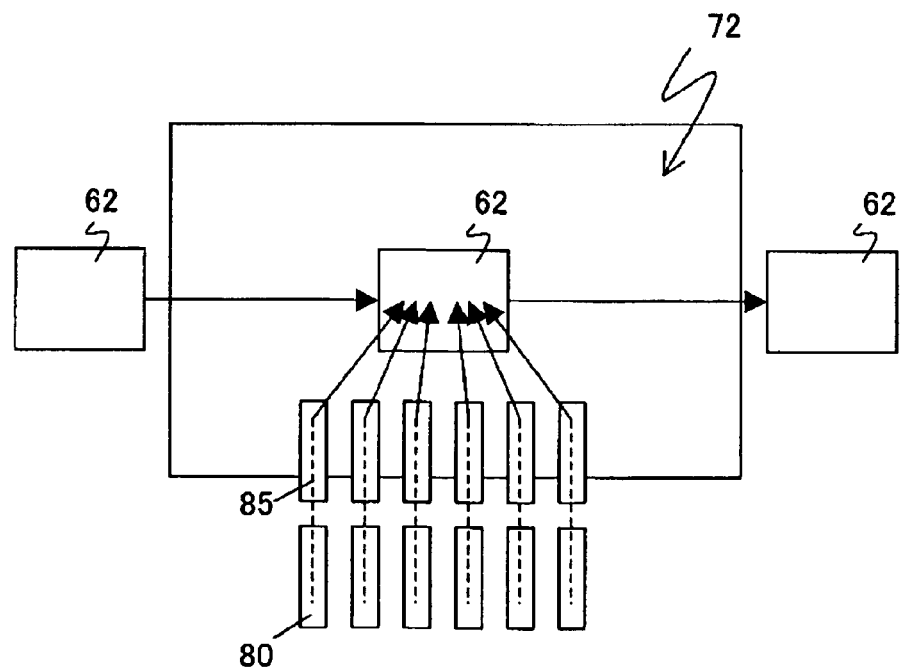
FIG. 12 is a schematic block diagram for explaining a mount process of the manufacturing method of the electronic unit shown in FIG. 9.

Referring now to FIGS. 8A-12, a description will be given of a manufacture of a printed (circuit) board (electronic unit) mounted with the electronic component 1 as a flip-chip. Here, FIGS. 8A-8D are schematic sectional views for explaining the electronic unit 60. FIG. 9 is a flowchart for explaining the manufacturing method of the electronic unit. FIG. 10 is a schematic block diagram of a system of a manufacturing method of the electronic unit. FIGS. 11 and 12 are schematic block diagrams for explaining the mount process.

Initially, the electronic component 1 is manufactured (step 1002). Next, the electronic component 1 is housed in the carrier tape 10 (step 1004). Next, the carrier tape 10 is wound around a reel 80 (step 1006). A component manufacturer performs these steps.

Next, the reel 80 is installed onto a tape feeder 85 (step 1008). The step 1008 and subsequent steps belong to an assembly line. In the transportation and treatment from the step 1006 to the step 1008, the electronic component 1 is likely to minutely rotate in the concave 20 and be fixed by the lower portion 23. FIG. 10 is a schematic sectional view of the reel 80 and the tape feeder 85. The tape feeder 85 feeds the carrier tape 10 in the right direction in FIG. 10 via a plurality of sprocket pins (not shown) inserted into the sprocket holes 14 of the carrier tape 10.

Separate from this electronic component, as shown in FIG. 8A, footprints 64 are formed on the printed board 62 (step 1010). The printed board 62 in which the footprints 64 are formed shown in FIG. 8A is supplied by a printed board manufacturer. In the assembly line, a slider screen printer applies solder on the footprints 64 of the printed board 62 as shown in FIG. 8B (step 1012).

Next, the printed board 62 is moved to a mount position and positioned, as shown in FIG. 12 (step 1014). In FIG. 12, a position of the center printed board 62 is the mount position.

Next, the carrier tape 10 is fed (or electronic component 1 is supplied) (step 1016). The feeding is performed from the reel 80 via the tape feeder 85. FIG. 12 shows a plurality of reels 80 and a plurality of tape feeders 85. Thereby, a variety of types of electronic components 1 can be supplied to the printed board 62.

Next, a mount unit 72 reduces the binding force to the electronic component 1 by the carrier tape 10 by stretching the sidewall 22 of the concave 20 to the outside near the perforation holes 26 and/or 28 (step 1018). Simultaneous with or just after the step 1018, the mount unit 72 picks up the electronic component 1 from the concave 20 of the carrier tape 10 (step 1020). The takeout is performed by an absorption nozzle 50 of the mount unit 72, and the inside of the absorption nozzle 50 is decompressed by an exhaust means (not shown). The absorption nozzle 50 absorbs the top surface 4 of the electronic component 1. A highly precise alignment is maintained between the electronic component 1 and the footprint 64 because the lower portion 23 of the sidewall 22 of the concave 20 maintains a position of the electronic component 1 to the absorption nozzle 50. The positioning of the electronic component is maintained by the concave 20 until the electronic component 1 is taken out, and the binding force just is reduced before the electronic component 1 is taken out. Thus, both maintaining of the positioning precision of the electronic component 1 in the carrier tape 10 and mitigating of the binding force at the time of takeout can be reconciled.

In this embodiment, the mount unit 72 has one of the first to fourth binding-force reducers 40A to 40D shown in FIGS. 4-7. FIG. 10 shows that the second binding-force reducer 40B is used. When the first binding-force reducer 40A is used, the hook tools are engaged with the perforation holes 26 and 28 and moved to the outside of the concave 20. The takeout becomes easy by stretching the lower portions 23 of the concave 20 using the hook tools. When the second binding-force reducer 40B is used, the tools having the tapered surfaces 44a are inserted into the perforation holes 26 and 28 so as to stretch the lower portions 23 of the sidewalls 22 using the tapered surfaces 44a. In addition, the tool is brought into contact with the bottom surface 2 of the electronic component 1, and moved in a direction in which the bottom surface 2 of the electronic component 1 can be separated from the bottom surface 24 of the concave 20. The takeout becomes easy by stretching the lower portions 23 of the concave 20 using the tapered surfaces 44a and by moving the electronic component 1. When the third binding-force reducer 40C is used, the wind P is supplied to part around the perforation holes 26 and 28 so as to stretch the lower portions 23 to the outside. When the fourth binding-force reducer 40D is used, the lower portions 23 of the sidewalls 22 are heated or receive the irradiated light, and are stretched to the outside. The wind P, heat or light F stretch the lower portions 23 and facilitates the takeout.

Next, the mount unit 72 places, on the printed board, 62 the electronic component 1 that has been taken out of the carrier tape 10, as shown in FIG. 8C (step 1022).

Next, the printed board 62 is exhausted by a belt conveyer (not shown) (step 1022), introduced into a reflow furnace 74 and heated by another means for soldering (step 1026). Thereby, as shown in FIG. 8B, the solder 66 is melted and soldered onto the footprints 70.

Thereafter, a visual inspector 96 performs a visual inspection (step 1028), and the electronic unit 60 is mounted onto an electronic apparatus, such as a personal computer and a server and shipped, once it passes the visual inspection. On the other hand, the electronic component 1 that fails in the visual inspection is detached from the printed board 62, and a new electronic component 1 is attached.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The present invention can provide a method for stably taking an electronic component out of a carrier tape.

What is claimed is:

1. A method to take an electronic component out of a carrier tape configured to house the electronic component in a concave that is defined by a sidewall and a bottom surface, the method comprising:
    reducing a binding force applied by the concave to the electronic component by stretching the sidewall to outside near a perforation hole that is formed in a portion of the bottom surface adjacent to the sidewall in the concave,
    wherein the reducing engages a hook tool with the perforation hole and moves the hook tool so as to stretch the sidewall to the outside.

2. A mount unit configured to take an electronic component out of a carrier tape that houses the electronic component in a concave defined by a sidewall and a bottom surface, and to mount the electronic component onto a printed board, the mount unit comprising:
    a binding-force reducer configured to reduce a binding force applied by the concave to the electronic component by stretching the sidewall to outside near a perforation hole that is formed in a portion of the bottom surface adjacent to the sidewall in the concave and
    an absorption nozzle configured to absorb a top surface of the electronic component opposite to a bottom surface of the electronic component which is opposite to the bottom surface of the concave,
    wherein the binding-force reducer includes a hook tool configured to engage with the perforation hole and to stretch the sidewall to the outside.

3. A method for taking an electronic component out of a carrier tape configured to house the electronic component in a concave that is defined by sidewalls and a bottom surface, the method comprising:
    reducing a binding force applied by the concave to the electronic component by stretching the sidewalls to outside near perforation holes formed at portions of the bottom surface adjacent to the sidewalls opposing each other,
    wherein the reducing inserts a pair of tools each of which has a tapered surface into the perforation holes respectively and stretches the sidewalls to the outside via the tapered surfaces, and the reducing brings the pair of tools into contact with a bottom surface of the electronic component opposite to the bottom surface of the concave and moving the pair of tools in a direction in which a bottom surface of the electronic component can be separated from the bottom surface of the concave.

4. A mount unit configured to take an electronic component out of a carrier tape that houses the electronic component in a concave defined by sidewalls and a bottom surface, and to mount the electronic component onto a printed board, the mount unit comprising:
    a binding-force reducer configured to reduce a binding force applied by the concave to the electronic component by stretching the sidewalls to outside near perforation holes formed at portions of the bottom surface adjacent to the sidewalls opposing each other; and
    an absorption nozzle configured to absorb a top surface of the electronic component opposite to a bottom surface of the electronic component which is opposite to the bottom surface of the concave,
    wherein the binding-force reducer includes a pair of tools each of which has a tapered surface configured to stretch the sidewalls to the outside, the pair of tools being configured to insert into the perforation holes respectively and contact a bottom surface of the electronic component and to move in a direction in which the bottom surface of the electronic component can be separated from the bottom surface of the concave.

5. The method of claim 1, comprising:
    removing the electronic component from the concave of the carrier tape.

6. The method of claim 1, wherein the reducing reduces the binding force by the concave to the electronic component just before the electronic component is removed.

7. The method of claim 1, wherein the reducing applies the binding force by the concave to the electronic component until the electronic component is removed.

8. The method of claim 1, wherein the hook tool has a triangle pole shape that possesses a tapered surface and an outer vertical surface.

9. The method of claim 1, wherein the hook tool has a U-shaped section.

10. The method of claim 1, comprising:
    supplying wind to a part around the perforation hole, heat around the perforation hole, or irradiate light onto part around the perforation hole, so as to stretch the sidewall to the outside.

11. The mount unit of claim 2, wherein the binding-force reducer reduces the binding force by the concave to the electronic component just before the electronic component is removed.

12. The mount unit of claim 2, wherein the binding-force reducer applies the binding force by the concave to the electronic component until the electronic component is removed.

13. The mount unit of claim 2, wherein the binding-force reducer comprises a blower configured to supply wind to a part around the perforation hole, a heater configured to heat around the perforation hole, or a light irradiator configured to irradiate light onto part around the perforation hole, so as to stretch the sidewall to the outside.

14. The mount unit of claim 2, wherein the hook tool is inserted simultaneous with or just before absorption by the absorption nozzle.

15. The mount unit of claim 2, wherein the hook tool has a triangle pole shape that possesses a tapered surface and an outer vertical surface.

16. The mount unit of claim 2, wherein the hook tool has a U-shaped section.

17. The method of claim 3, comprising:
    supplying wind to a part around the perforation hole, heat around the perforation hole, or irradiate light onto part around the perforation hole, so as to stretch the sidewall to the outside.

18. The mount unit of claim 4, wherein the hook tool is inserted simultaneous with or just before absorption by the absorption nozzle.

19. The mount unit of claim 4, wherein the binding-force reducer comprises a blower configured to supply wind to a part around the perforation hole, a heater configured to heat around the perforation hole, or a light irradiator configured to irradiate light onto part around the perforation hole, so as to stretch the sidewall to the outside.

* * * * *

UNITED STATES PATENT AND TRADEMARK OFFICE
CERTIFICATE OF CORRECTION

PATENT NO. : 8,196,278 B2  
APPLICATION NO. : 12/654116  
DATED : June 12, 2012  
INVENTOR(S) : Tomokazu Nakashima et al.

Page 1 of 1

It is certified that error appears in the above-identified patent and that said Letters Patent is hereby corrected as shown below:

Column 9, Line 31, In Claim 2, delete "concave" and insert -- concave; --, therefor.

Signed and Sealed this
Twenty-eighth Day of August, 2012

David J. Kappos
*Director of the United States Patent and Trademark Office*